(12) United States Patent
Entalai et al.

(10) Patent No.: US 8,546,268 B2
(45) Date of Patent: Oct. 1, 2013

(54) MANUFACTURING INTEGRATED CIRCUIT COMPONENTS HAVING MULTIPLE GATE OXIDATIONS

(75) Inventors: Wilson Entalai, Kuching Sarawak (MY); Jerry Liew, Kuching Sarawak (MY)

(73) Assignee: X-FAB Semiconductor Foundries AG, Erfurt (DE)

( * ) Notice: Subject to any disclaimer, the term of this patent is extended or adjusted under 35 U.S.C. 154(b) by 31 days.

(21) Appl. No.: 13/262,307

(22) PCT Filed: Apr. 30, 2009

(86) PCT No.: PCT/IB2009/051773
§ 371 (c)(1),
(2), (4) Date: Sep. 30, 2011

(87) PCT Pub. No.: WO2010/125428
PCT Pub. Date: Nov. 4, 2010

(65) Prior Publication Data
US 2012/0034783 A1 Feb. 9, 2012

(51) Int. Cl.
*H01L 21/302* (2006.01)
(52) U.S. Cl.
USPC ............ 438/717; 438/221; 438/723; 438/738
(58) Field of Classification Search
USPC ................. 438/218, 225, 700, 706, 722, 723, 438/725, 73, 10, 221, 717, 738, 761
See application file for complete search history.

(56) References Cited

U.S. PATENT DOCUMENTS

| 7,534,684 | B2 * | 5/2009 | Lee et al. | 438/275 |
| 2002/0111046 | A1 | 8/2002 | Park et al. | |
| 2003/0067050 | A1 | 4/2003 | Kim | |
| 2003/0124793 | A1 | 7/2003 | Tsuji | |
| 2003/0235964 | A1 | 12/2003 | Wolstenholme et al. | |
| 2005/0196928 | A1 | 9/2005 | Bonser et al. | |
| 2006/0211190 | A1 * | 9/2006 | Chen et al. | 438/221 |
| 2008/0124872 | A1 | 5/2008 | Verma et al. | |
| 2009/0256233 | A1 * | 10/2009 | Eun | 257/510 |

OTHER PUBLICATIONS

Seong-Ho Kim et al; New STI Scheme to Compensate Gate Oxide Thinning at STI Corner Edge for the Devices Using Thick Dual Gate Oxide; Extended Abstracts of the 2001 International Conference on Solid State Devices and Materials; Sep. 26, 2001; pp. 194-195; XP-001074548; Tokyo.
Rosello, Garcia M.; International Search Report for PCT/IB2009/051773—mailed Aug. 18, 2009; European Paent Office, Rijswijk Netherlands.

* cited by examiner

*Primary Examiner* — Lan Vinh
(74) *Attorney, Agent, or Firm* — Stevens & Showalter LLP

(57) ABSTRACT

STI divot formation is minimized and STI field height mismatch between different regions is eliminated. A nitride cover layer (150) having a thickness less than 150 then a oxide cover layer (160) having a thickness less than 150 is deposited acting as implant buffer after pad oxide removal following the STI CMP process. This nitride or oxide stack is selectively removed by masking prior to gate oxidation of each LV (low voltage) region (GX1), MV (intermediate voltage) region (GX3) and HV (high voltage) region (GX5) respectively followed by a gate poly deposition.

19 Claims, 4 Drawing Sheets

MANUFACTURING INTEGRATED CIRCUIT COMPONENTS HAVING MULTIPLE GATE OXIDATIONS

FIELD OF THE INVENTION

The invention as disclosed relates to a method of manufacturing integrated circuit (IC) components comprising multiple devices having different gate oxidations to be configured to operate at different voltages.

BACKGROUND OF THE INVENTION

With shrinking geometries of IC devices to quarter micron and below, shallow trench insulation (STI) technique is widely used to isolate IC elements on the wafer substrate level. Conventional STI fabrication methods comprises forming a pad oxide on the surface of a silicon substrate, forming a nitride polish stop layer, forming STI trenches by anisotropic etching of the nitride polish stop layer and a certain depth of the wafer substrate, typically to a depth of 3000 Å. Thermal oxide liner is then formed in the trench, and optionally a thin nitride liner, and is then filled with silicon oxide insulating material. STI chemical mechanical polishing (CMP) is then implemented and the nitride layer (defining the active regions) and pad oxide removed. A sacrificial thermal oxide layer typically 150 Å to 250 Å thick is grown followed by various masking, ion implantation and cleaning steps. The cleaning steps of isotropic nature cause oxide loss at top corners of the STI leading to divot formation. The divot severity increases with each clean step and longer cleaning time. The enhanced field oxide etch rate due to ion implantation doping further exacerbates the problem.

The divots are detrimental, particularly at low voltage region with the most severe recess, where circuitries and elements such as memory array, capacitors and etc. will typically be formed. Divots negatively influence among others junction leakage, junction breakdown and threshold voltage.

STI field step height difference between different regions and to substrate poses great challenge to patterning of gate poly features. Minimum photo resist thickness is desired to achieve better focus margin, and is typically limited by the minimum thickness required to mask the gate poly etch by reactive ion etch (RIE). Photo resist thickness has to be increase to cater for the step height difference at the expense of focus margin. Another key challenge due to the step height difference is the resulting gate poly width after gate poly etch (not described). It is not uncommon to observe gate poly width increase of 5 nm or more when the gate poly line traverses from substrate region to STI field region. This potentially causes subsequent inter-level dielectric (ILD) gap fill issue and electrical characteristic mismatch to design characteristic.

According to US 2005/196928 A1 a STI divot formation is eliminated or substantially reduced by employing a very thin nitride polish stop layer, e.g. having a thickness less than 400 Å. The very thin nitride polish stop layer is retained in place during subsequent masking, implanting and cleaning steps to form dopant regions, and is removed prior to gate oxide and gate electrode formation. In particular the method of fabricating a semiconductor device comprises: forming a nitride polish stop layer, at a thickness no greater than 400 Å, over a semiconductor substrate; forming an opening in the nitride polish stop layer and a trench in the substrate; filling the trench with insulating material forming an overburden on the nitride polish stop layer; and polishing to form an upper planar surface stopping of the nitride polish stop layer, thereby forming a shallow trench isolation region. The nitride polish stop layer is formed at a thickness of 50 Å to 150 Å.

A drawback of the above method is that a sufficiently thick buffer layer is required to compensate subsequent oxide loss during conventional dual or triple gate oxidation process, gate poly sidewall formation and silicidation. This is particularly critical for LV regions where typically low voltage transistors are defined. Higher ion implant energies will be needed leading the higher implanted ion spread in the substrate. Also, removing the nitride stop and pad oxide layer relieve stress from the substrate.

Furthermore, a sacrificial oxide is grown as implant buffer by conventional method. The exposed STI field oxide is subjected to many masking, ion implantation, wet cleaning and gate oxidation HF cleans leading to divots formation and field step height imbalance at different regions.

The sacrificial oxide is removed prior to gate oxidation by wet clean. A sacrificial oxide of 200 Å thick typically leads to about 300 Å field oxide loss. High voltage (HV) thermal gate oxide (GOX) is first grown, and then removed from the low voltage (LV) and the intermediate voltage (MV) region by selective wet clean by masking. A typical 70 Å gate oxide leads to about 130 Å field oxide loss. MV thermal GOX is then grown, and then removed from the LV region by selective wet clean. A typical 65 Å MV GOX leads to about 110 Å field oxide loss. The LV thermal GOX is now grown and gate poly deposited. The LV region has now a potential divot recess of more than 540 Å and a field step height difference of 240 Å or more relative to the HV region. The HV region has a potential field step height difference of 540 Å or more relative to the substrate level.

According to US 2008/124872 A1 a method for forming TGO structures (triple gate oxide) includes providing a substrate containing regions of first, second and third kinds in which devices with respective first, second and third gate oxide layers of different thicknesses are to be formed. The second gate oxide layer is formed over the substrate and then removed from regions of the first kind where the first gate oxide layer is subsequently grown. A first conductive layer is deposited over the substrate. The first conductive layer and second gate oxide layer are subsequently removed from regions of the third kind. The third gate oxide layer followed by deposition of a second conductive layer is formed over the substrate and then removed except from over regions of the third kind. In particular the method of forming triple gate oxide (TGO) structures comprises: Providing a substrate comprising regions of a first kind, regions of a second kind, regions of a third kind, internal isolation regions which separate devices within each region and bounding isolation regions which separate devices of different regions; forming a second gate oxide layer said regions of the first, second and the third kind; removing said second gate oxide layer from said regions of the first kind; forming a first gate oxide layer over said regions of the first kind; forming a first conductive layer over said regions of the first, second and the third kind; removing said first conductive layer and said second gate oxide from said regions of the third kind; forming a third gate oxide layer; forming a second conductive layer over said regions of the first kind, said regions of the second kind and said regions of the third kind; removing said second conductive layer and said third gate oxide layer from said regions of the first kind and said regions of the second kind; forming a third conductive layer over said regions of the first kind, said regions of the second kind and said regions of the third kind; completing fabrication of devices in said regions of the first kind, said regions of the second kind and said regions of the third kind according to standard manufacturing procedures wherein the first, second and third gate oxide layers have different thickness, the first gate oxide layer being the thickest and the third gate oxide layer being the thinnest.

Therefore, a need exists for a fabrication method to minimize STI divots formation, STI field step height difference between different regions, and STI field step height difference to substrate.

SUMMARY OF THE INVENTION

The invention relates to a method to minimize divot formation in shallow trench isolation (STI) regions and formation of multiple, in particular dual or triple, gate oxide regions followed by a gate poly deposition with a minimal STI field height mismatch.

The method of manufacturing integrated circuit components of the invention including multiple devices having gate oxidations and being configured to operate at different voltages, comprises the steps of providing a substrate having shallow trench isolation regions; forming a nitride cover layer having a thickness less than 150 Å on the substrate and the shallow trench isolation regions and forming an oxide cover layer having a thickness less than 150 Å on the nitride cover layer. Thereafter, the oxide cover layer and the nitride cover layer are removed from a first region of a first device configured to operate at a first voltage range, and a first gate oxidation is grown, Thereafter, the oxide cover layer and the nitride cover layer are removed from a second region of a second device configured to operate at a second voltage range lower then the first voltage range, and a second gate oxidation is grown. Finally, the oxide cover layer and the nitride cover layer are removed from a third region of a third device configured to operate at a third voltage range lower then the second voltage range, and a third gate oxidation is grown.

According to the invention as claimed, a dual layer implant buffer is formed following removal of pad oxide. A nitride cover layer having a thickness less than 150 Å is deposited followed by an oxide cover layer having a thickness less than 150 Å. Thereafter various masking, ion implantation and cleaning steps are implemented by typical semiconductor fabrication methods while the nitride cover layer and the oxide cover layer on the substrate and the STI regions protect the covered areas and minimize the divot formation and the STI filed height difference.

Preferable, the oxide cover layer and the nitride cover layer are removed from the first region by masking the second region and the third region, removing the oxide cover layer from the first region, removing the mask from the second region and the third region and removing the nitride cover layer from the first region; and from the second region by masking the first region and the third region, removing the oxide cover layer from the second region, removing the mask from the first region and the third region and removing the nitride cover layer; and from the third region by masking the first region and the second region, removing the oxide cover layer from the third region, removing the mask from the first region and the second region and removing the nitride cover layer from the third region. This allows to use of the most effective chemical to be used for the removal of the nitride cover layer and the oxide cover layer respectively.

Preferably, the nitride cover layer is deposited as implant buffer with a thickness in a range of 50 Å to 150 Å, while the oxide cover layer is deposited as implant buffer with a thickness in a range between 50 Å to 150 Å. This is advantageous because it ensures the required protection of the underlying structure and minimizes the effort to deposit these layers, or with a view on a compromise between the efficiency of the manufacturing process and the protection of the substrate and STI field oxide surfaces.

The oxide cover layer may be removed by a HF chemical substance, preferably either diluted HF (DHF) or buffered HF (BHF). The photo resist may be removed by a sulphuric acid and the nitride cover layer may be removed by a phosphoric acid (claims 7, 8).

Preferably, the gate oxidation of the first device is grown, preferably by thermal oxidation, with a thickness range between 120 Å to 400 Å, and the gate oxidation of the first device is formed only at first region. The gate oxidation of the second device is grown, preferably by thermal oxidation, with a thickness range of 40 Å to 120 Å, and the gate oxidation of the second device is formed at the first and second regions. The gate oxidation at the third gate oxide region is grown, preferably by thermal oxidation, with thickness range of 15 Å to 40 Å, and the gate oxidation of the third device is formed at the first, second and third regions. This is advantageous for components where the first voltage range is a high voltage range from 5 V to 12 V, the second voltage range is an intermediate voltage range from 2.5 V to 5 V, and the third voltage range is a low voltage range from 1 V to 2.5 V. The values are "substantially" values, no strict borders (claims 12 to 15).

The gate polysilicon with thickness range of 1500 Å to 2500 Å is deposited and subsequent devices fabrication is completed by typical methods.

The claimed invention allows to potentially develop competitive circuitry elements, transistors in particular with very low sub-threshold leakage current due to absence of STI divot. The present invention further allows potentially developing ICs with low mismatch to actual silicon due to minimal width variation in gate poly traversing the substrate and field regions. The stated potential advantages can be achieved with minimal addition of one masking step, giving good performance to cost ratio.

BRIEF DESCRIPTION OF THE DRAWINGS

FIG. 3 through

DETAILED DESCRIPTION OF THE PREFERRED EMBODIMENTS

The embodiments aim to minimize divot formation associated to fabrication of STI region by conventional method. A further aim is to minimize STI field step height differences between different regions associated to fabrication of regions by conventional methods.

The disclosed method is for manufacturing integrated circuit components comprising multiple devices having different gate oxidations to be configured to operate at different voltages, where a first voltage range is a high voltage (HV) range from 5 V to 12 V, a second voltage range is an intermediate voltage (MV) range from 2.5 V to 5 V, and a third voltage range is a low voltage (LV) range from 1 V to 2.5 V.

Figure 1:
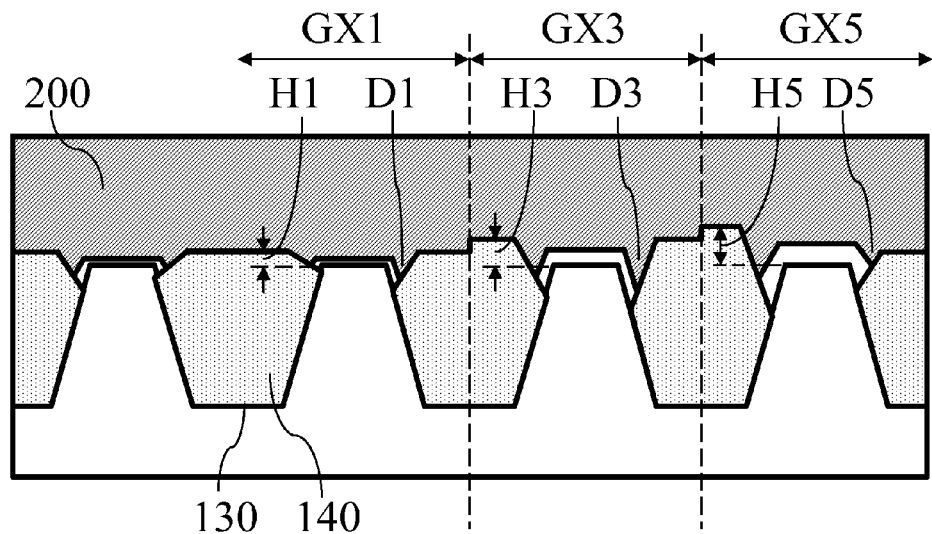
FIG. 1 shows, in cross-sectional views, divot formation and field step height difference in different regions, after gate poly deposition, fabricated by typical methods.

FIG. 1 illustrates a device after gate poly 200 deposition having a LV region GX1, a MV region GX3, a HV region GX5; a STI trench 130 and a field oxide 140. A divot recess D1 is shown at the LV region GX1, a divot recess D3 is shown at the MV region GX3 and a divot recess D5 is shown at HV region GX5. A STI step height at the LV region GX1 is H1, a STI step height at MV region GX3 is H3, and a STI step height at HV region GX5 is H5. D1 is greater than D3, and D3 is greater than D5. H5 is greater than H3 and H3 is greater than H1.

Figure 2:
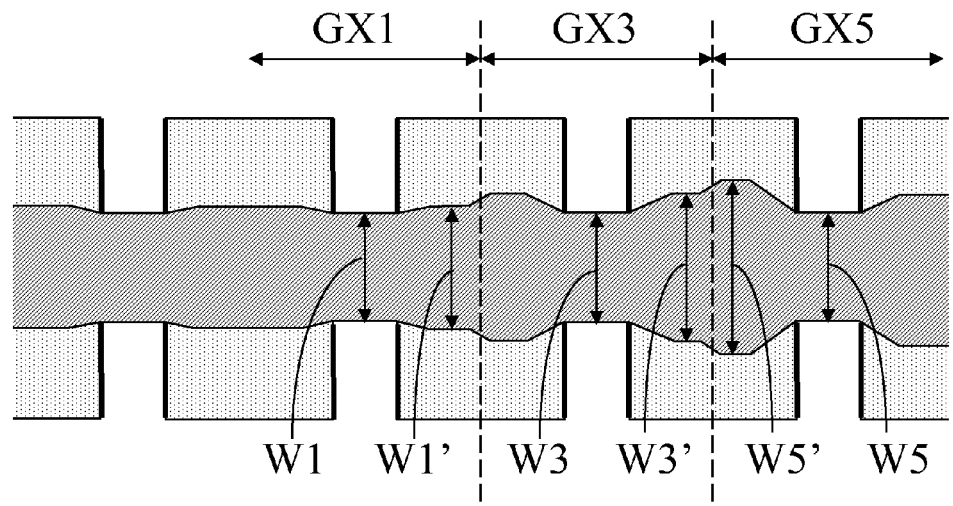
FIG. 2 shows, in planar view, gate poly width traversing different regions of the component of FIG. 1.

FIG. 2 illustrates the device after gate poly etch. The gate poly width across substrate is W1, the gate poly width across field at LV region GX1 is W1', the gate poly width across substrate is W3, the gate poly width across field at MV region GX3 is W3', the gate poly width across substrate is W5 and the gate poly width across field at HV region GX5 is W5'. Therein, W1' is greater than W1, W3' is greater than W3, W5' is greater than W5.

The gate oxidation of the HV region, made by thermal oxidation, has a thickness range between 120 Å to 400 Å, and the gate oxidation of the MV device, made by thermal oxidation, has a thickness range of 40 Å to 120 Å, and the gate oxidation of the LV device, made by thermal oxidation, has a thickness range of 15 Å to 40 Å.

Figure 3:
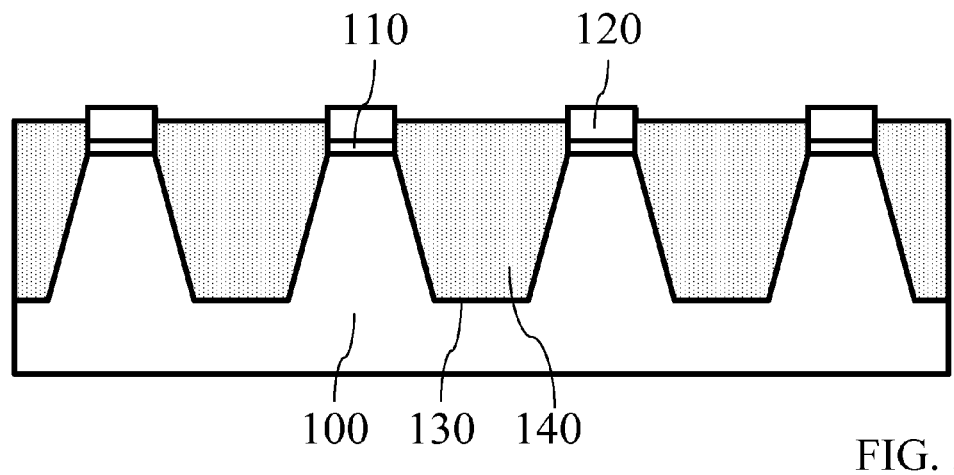
Figure 4:
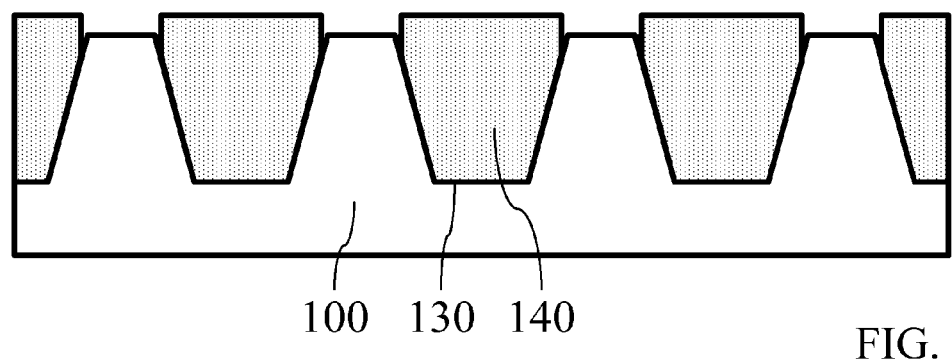

In the embodiments conventional methods are implemented in growing the pad oxide 110 on substrate 100, depositing the nitride polish stop layer 120, forming the STI trenches 130, forming the STI liner (not shown), filling field oxide 140 into the STI trenches, planarizing the field oxide 140 by STI chemical mechanical polishing (CMP). FIG. 3 illustrates the cross-section view at this stage. Thereafter the nitride polish stop layer 120 is removed and then pad oxide 110 is removed. The cross-section view formed at this stage is shown in FIG. 4.

In accordance to the embodiments of the invention, a thin nitride cover layer 150 having a thickness less than 150 Å, e.g. 70 Å, is deposited and a oxide cover layer 160 of a thickness less than 150 Å, e.g. 70 Å, is deposited. The nitride cover layer 150 and the oxide cover layer 160 are deposited to cover both the surface of the substrate and the STI field oxide surfaces. The nitride cover layer 150 prevents STI field oxide loss thus divot during subsequent masking, ion implants, cleaning.

Figure 5:
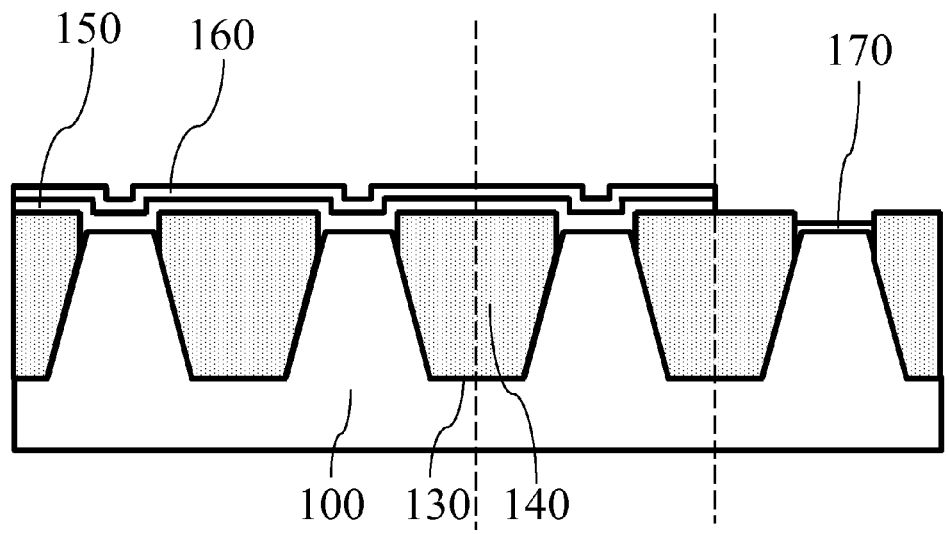

In the embodiments of the invention as illustrated in FIG. 5, HV gate oxidation is first formed. LV and MV regions are masked (not shown), and the oxide cover layer 160 is removed by HF from HV region (not shown). The mask is removed and the nitride cover layer 150 is removed by $H_3PO_4$ from HV region (not shown). HV gate oxide 170 e.g. 70 Å thick is grown.

Figure 6:
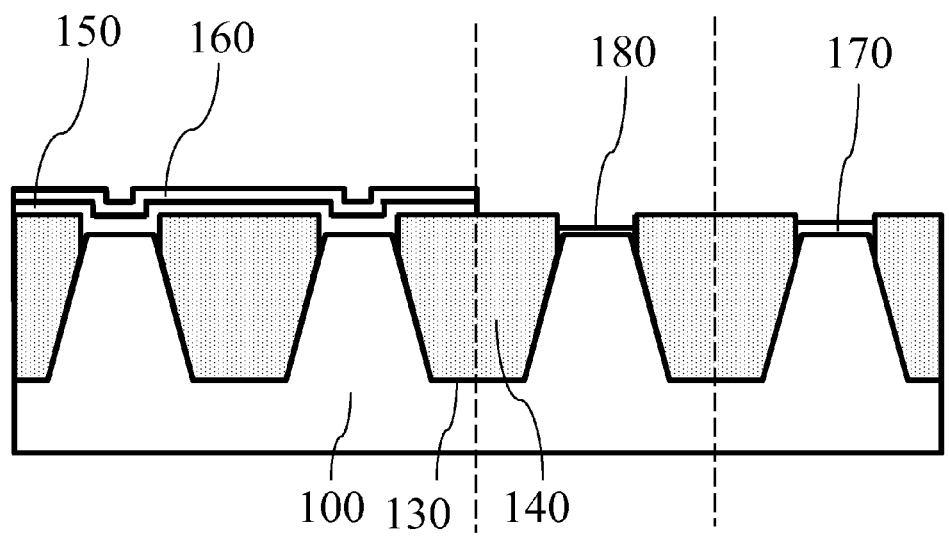

MV gate oxidation is next formed, as showed in FIG. 6. LV and HV regions are masked (not shown), and the oxide cover layer 160 is removed by HF from MV region (not shown), the mask is removed, and the nitride cover layer 150 is removed by $H_3PO_4$ chemical from MV region (not shown). MV gate oxide 180, e.g. 60 Å thick is grown. During MV gate oxidation, HV gate oxide 170 thickness is increased to e.g. 120 Å.

Figure 7:
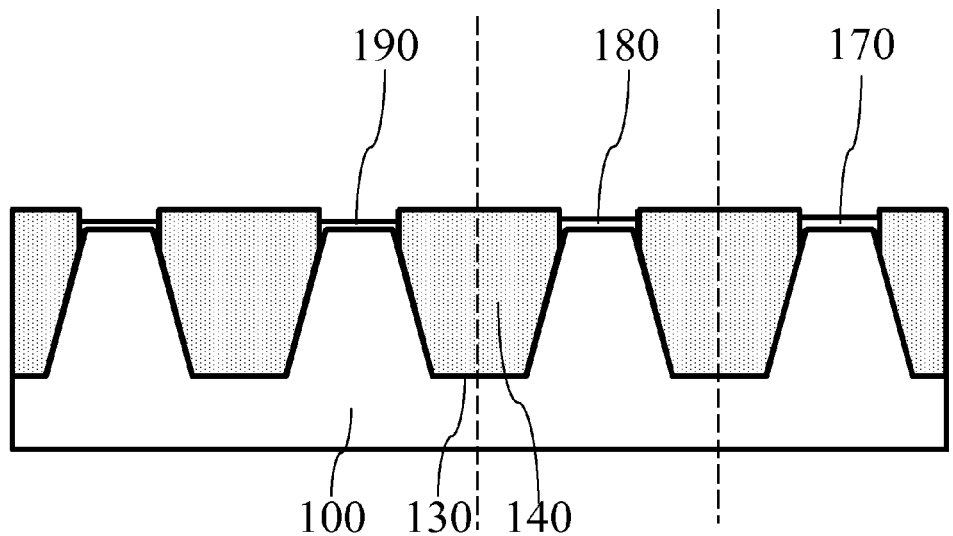

Referring to FIG. 7, LV gate oxidation is now formed. MV and HV regions are masked (not shown), and the oxide cover layer 160 removed by HF from LV region (not shown), the mask removed, and the nitride cover layer 150 removed by $H_3PO_4$ from LV region (not shown). LV gate oxide 190 e.g. 30 Å thick is grown. During LV gate oxidation, HV gate oxide 170 the thickness is further increased to e.g. 130 Å, and MV gate oxide 180 thickness is further increased to e.g. 70 Å. A final LV gate oxide 190 thickness of 30 Å, MV gate oxide 180 the thickness of 70 Å, and HV gate oxide thickness 170 of 130 Å is achieved in this embodiment.

Thus, the nitride/oxide stack is selectively removed by masking prior to gate oxidation of each of a plurality of LV regions GX1, MV regions GX3 and HV regions GX5 respectively followed by gate poly deposition.

Figure 8:
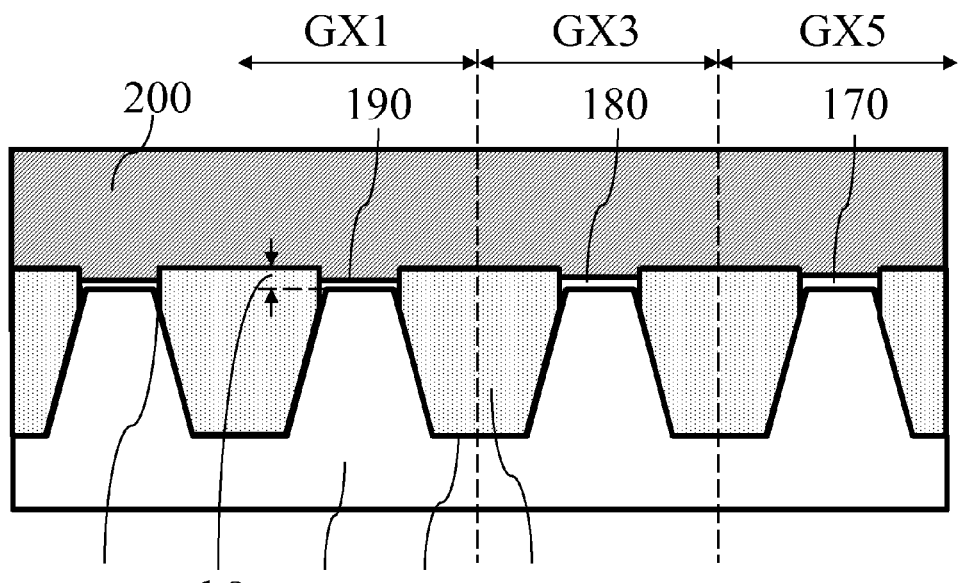
FIG. 8 show—in cross-sectional views—a method for forming STI region and regions in accordance with an embodiment of the disclosed invention.

As illustrated in FIG. 8, gate poly 200 is now deposited with thickness typically between 1500 Å and 2500 Å e.g. 2000 Å. Divot d9 with minimal recess and minimal step height h9 is achieved for all regions GX1, GX3 and GX5. GX1 is configured to operate below 2.5 V. GX5 is configured to operate above 5 V. The voltages above 5 V are high voltage "HV". The voltages below 2.5 V are low voltages "LV".

There is an intermediate voltage MV that is used to describe the configuration of the GX3 region. It would not operate above substantially 5 V, but can operate above 2.5 V.

The semiconductor devices construction is now completed following typical fabrication methods.

Methods of this semiconductor fabrication have been disclosed to attain semiconductor devices with minimal STI divots and minimal STI field height difference between various regions and also to the substrate level.

Exemplary embodiments were shown, not meant to be restrictive. It will be evident that variations and changes may be made by those skilled in the art without departing from the scope of the claims. The specification and drawings are illustrative and are not intended to be taken as limiting the claims' language as understood by the skilled man in the art.

The invention claimed is:

1. A method of manufacturing integrated circuit components comprising multiple devices having different gate oxidations configured to operate at different voltages, the method comprising the steps of:

providing a substrate (100) having shallow trench isolation regions (130, 140);

forming a nitride cover layer (150) having a thickness less than 150 A on the substrate (100) and the shallow trench isolation regions;

forming an oxide cover layer (160) having a thickness less than 150 A on the nitride cover layer (150);

removing the oxide cover layer (160) and the nitride cover layer (150) from a first region (GX5) of a first device configured to operate in a first voltage range;

growing a first gate oxidation;

removing the oxide cover layer (160) and the nitride cover layer (150) from a second region (GX3) of a second device configured to operate in a second voltage range lower than the first voltage range;

growing a second gate oxidation;

removing the oxide cover layer (160) and the nitride cover layer (150) from a third region (GX1) of a third device configured to operate in a third voltage range lower than the second voltage range; and growing a third gate oxidation;

wherein:

the step of removing the oxide cover layer (160) and the nitride cover layer (150) from the first region (GX5) comprises:

masking the second region (GX3) and the third region (GX1);

removing the oxide cover layer (160) from the first region (GX5);

removing the mask from the second region (GX2) and third region (GX1); and removing the nitride cover layer (150) from the first region (GX5);

the step of removing the oxide cover layer (160) and the nitride cover layer (150) from the second region (GX3) comprises:

masking the first region (GX5) and the third region (GX1);

removing the oxide cover layer (160) from the second region (GX3);

removing the mask from the first region (GX5) and third region (GX1); and removing the nitride cover layer (150) from the second region (GX3); and the step of removing the oxide cover layer (160) and the nitride cover layer (150) from the third region (GX1) comprises:

masking the first region (GX5) and the second region (GX3);

removing the oxide cover layer (160) from the third region (GX1);

removing the mask from the first region (GX5) and the second region (GX3); and removing the nitride cover layer (150) from the third region (GX1).

2. The method of claim 1, wherein the nitride cover layer (150) is deposited as implant buffer with a thickness in a range of 50 Å to 150 Å.

3. The method of claim 1, wherein the oxide cover layer (160) is deposited as implant buffer with a thickness in a range between 50 Å to 150 Å.

4. The method of claim 1, wherein the nitride cover layer (150) is removed by a $H_3PO_4$ chemical substance.

5. The method of claim 1, wherein the first voltage range is a high voltage range from 5 V to 12 V, the second voltage range is an intermediate voltage range from 2.5 V to 5 V, and the third voltage range is a low voltage range from 1 V to 2.5 V.

6. The method of claim 1, wherein the first region (GX5) is configured to operate above about 5 V.

7. The method of claim 1, wherein the second region (GX3) is configured to operate at no more than about 5 V.

8. The method of claim 1, wherein the third region (GX1) is configured to operate at no more than about 2.5 V.

9. The method of claim 1, further comprising depositing a gate polysilicon with a thickness in a range of 1500 Å to 2500 Å.

10. The method of claim 1, wherein the first region (GX5) and the second region (GX3), the first region (GX5) and the third region (GX1), and the second region (GX3) and the third region (GX1) are each masked with a photo resist.

11. The method of claim 10, wherein each photo resist is removed by sulphuric acid.

12. The method of claim 1, wherein the oxide cover layer (160) is removed by a HF chemical substance.

13. The method of claim 12, wherein the oxide cover layer (160) is removed by one of a diluted HF (DHF) chemical substance and a buffered HF (BHF) chemical substance.

14. The method of claim 1, wherein growing a first gate oxidation comprises growing the first gate oxide (170) of the first device with a thickness range of 120 Å to 400 Å thus forming a gate oxidation only at the first region (GX5).

15. The method of claim 14, wherein the first gate oxidation is grown by thermal oxidation.

16. The method of claim 14, wherein growing a second gate oxidation comprises growing the second gate oxidation (180) with a thickness range of 40 Å to 120 Å thus forming a gate oxidation at the first region (GX5) and second region (GX3).

17. The method of claim 16, wherein growing a third gate oxidation comprises growing a third gate oxidation (190) with a thickness range of 15 Å to 40 Å, thus forming a gate oxidation at the first region (GX5) and second region (GX3) and third region (GX1).

18. The method of claim 16, wherein the second gate oxidation is grown by thermal oxidation.

19. The method of claim 17, wherein the third gate oxidation is grown by thermal oxidation.

* * * * *

UNITED STATES PATENT AND TRADEMARK OFFICE
CERTIFICATE OF CORRECTION

Page 1 of 2

PATENT NO. : 8,546,268 B2
APPLICATION NO. : 13/262307
DATED : October 1, 2013
INVENTOR(S) : Wilson Entalai et al.

It is certified that error appears in the above-identified patent and that said Letters Patent is hereby corrected as shown below:

In the Specifications:

Col. 3, lines 27-28, "oxidation is grown, Thereafter, the oxide cover" should read --oxidation is grown. Thereafter, the oxide cover--;

Col. 3, line 31, "voltage range lower then the first voltage" should read --voltage range lower than the first voltage--;

Col. 3, line 34, "voltage range lower then the second voltage" should read --voltage range lower than the second voltage--;

Col. 3, line 59, "This allows to use of the most effective chemical" should read --This allows the use of the most effective chemical--.

In the Claims:

Col. 6, line 33, "having a thickness less than 150 A" should read --having a thickness less than 150 Å--;

Col. 6, line 36, "having a thickness less than 150 A" should read --having a thickness less than 150 Å--;

Col. 7, line 20, "thickness in a range of 50 A to 150 A" should read --thickness in a range of 50 Å to 150 Å--;

Col. 7, line 23, "thickness in a range of 50 A to 150 A" should read --thickness in a range of 50 Å to 150 Å--;

Signed and Sealed this
Eighteenth Day of March, 2014

Michelle K. Lee
*Deputy Director of the United States Patent and Trademark Office*

CERTIFICATE OF CORRECTION (continued)

U.S. Pat. No. 8,546,268 B2

Col. 8, lines 5-6, "the second region (GX3),the first region (GX5) and the third region (GX1),and the second" should read --the second region (GX3), the first region (GX5) and the third region (GX1), and the second--;

Col. 8, lines 2-3, "thickness in a range of 1500 A to 2500 A" should read --thickness in a range of 1500 Å to 2500 Å--.